(12) United States Patent
Kong et al.

(10) Patent No.: US 7,494,292 B2
(45) Date of Patent: Feb. 24, 2009

(54) IMAGE SENSOR MODULE STRUCTURE COMPRISING WIRE BONDING PACKAGE AND METHOD OF MANUFACTURING THE IMAGE SENSOR MODULE STRUCTURE

(75) Inventors: Yung-Cheol Kong, Chungcheongnam-do (KR); Byoung-Rim Seo, Seoul (KR); Jae-Cheon Do, Chungcheongnam-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 580 days.

(21) Appl. No.: 11/127,333

(22) Filed: May 11, 2005

(65) Prior Publication Data

US 2005/0285016 A1    Dec. 29, 2005

(30) Foreign Application Priority Data

Jun. 29, 2004 (KR) ............... 10-2004-0049727

(51) Int. Cl.
*G03B 17/26* (2006.01)
(52) U.S. Cl. .................... 396/529; 348/340
(58) Field of Classification Search ........... 348/340, 348/342, 335, 373, 374, 375, 376; 359/819, 359/822; 396/529; 250/208.1, 239; 257/432, 257/433, 434, 436, 440, 428, 431
See application file for complete search history.

(56) References Cited

U.S. PATENT DOCUMENTS

| | | | | |
|---|---|---|---|---|
| 6,122,009 A * | 9/2000 | Ueda | ............... | 348/335 |
| 6,389,687 B1 | 5/2002 | Glenn et al. | ............... | 29/832 |
| 6,566,745 B1 * | 5/2003 | Beyne et al. | ............... | 257/680 |
| 7,122,874 B2 * | 10/2006 | Kim | ............... | 257/433 |
| 7,227,236 B1 * | 6/2007 | Lee et al. | ............... | 257/433 |
| 2002/0149075 A1 * | 10/2002 | Lizima et al. | ............... | 257/433 |
| 2003/0004941 A1 | 1/2003 | Yamada et al. | ............... | 707/3 |
| 2004/0061799 A1 * | 4/2004 | Atarashi et al. | ............... | 348/340 |
| 2004/0095501 A1 * | 5/2004 | Aizawa et al. | ............... | 348/340 |
| 2004/0212717 A1 * | 10/2004 | Minamio et al. | ............... | 348/340 |
| 2005/0247992 A1 * | 11/2005 | Tsukamoto et al. | ............... | 257/433 |
| 2005/0258502 A1 * | 11/2005 | Kong et al. | ............... | 257/433 |

(Continued)

FOREIGN PATENT DOCUMENTS

JP     2000-322990     11/2000

(Continued)

OTHER PUBLICATIONS

Translation of JP Publication No. 2003-332542 provided.*

(Continued)

*Primary Examiner*—W. B. Perkey
*Assistant Examiner*—Fang-Chi Chang
(74) *Attorney, Agent, or Firm*—Marger Johnson & McCollom, P.C.

(57) ABSTRACT

An image sensor module structure includes an image sensor package, a housing, and an underfiller. The image sensor package includes a substrate having interconnection pads formed on an outermost edge. The housing includes a filter projecting from a bottom surface of a housing body. The projecting filter is attached on an image sensor chip using various adhesive patterns. Further, the underfiller is formed in a space between the housing body and the image sensor package.

37 Claims, 7 Drawing Sheets

U.S. PATENT DOCUMENTS

2005/0258518 A1* 11/2005 Yang et al. .................. 257/666
2006/0016973 A1* 1/2006 Yang et al. .................. 250/239
2006/0030074 A1* 2/2006 Mund et al. ................. 438/108

FOREIGN PATENT DOCUMENTS

JP          2003-197885         7/2003
JP          2003-332542         11/2003

OTHER PUBLICATIONS

Translation of JP Publication No. 2003-332542 (Nov. 21, 2003) provided.*
English language abstract of Japanese Publication No. 2000-322990.
English language abstract of Japanese Publication No. 2003-197885.

* cited by examiner

IMAGE SENSOR MODULE STRUCTURE COMPRISING WIRE BONDING PACKAGE AND METHOD OF MANUFACTURING THE IMAGE SENSOR MODULE STRUCTURE

BACKGROUND OF THE INVENTION

This application claims the priority of Korean Patent Application No. 2004-49727, filed on Jun. 29, 2004, in the Korean Intellectual Property Office, the disclosure of which is incorporated herein in its entirety by reference.

1. Field of the Invention

The present invention relates to an image sensor module structure and a method of manufacturing the image sensor module structure, and more particularly, to an image sensor module structure comprising a wire bonding package, and a method of manufacturing the image sensor module structure.

2. Description of the Related Art

Image sensors are semiconductor electronic devices that convert optical information into electrical signals. Examples of Image sensors include charge coupled device (CCD) image sensors and complementary metal oxide semiconductor (CMOS) image sensors. As cameras, camcorders, personal computer (PC) cameras, and surveillance cameras are digitalized, applications of image sensors are increasing. In particular, a tremendous growing demand for mobile devices equipped with image sensors, such as camera phones, has accelerated the demand for smaller, thinner image sensor modules.

FIG. 1 is a schematic sectional view of a conventional image sensor module structure comprising a wire bonding package. Referring to FIG. 1, an image sensor module structure 100 includes an image sensor package composed of a substrate 110, an image sensor chip 112, and wires 116, a housing body 120, an infrared ray (IR) cut filter 130, and a lens assembly 140. The housing body 120, the IR cut filter 130, and the lens assembly 140 are collectively referred to as a housing.

The image sensor package is a wire bonding package composed of the substrate 110, the image sensor chip 112, and the wires 116. A light receiving area 114 is formed at the center of a top surface of the image sensor chip 112, and the image sensor chip 112 is mounted on the substrate 110. The image sensor chip 112 and the substrate 110 are electrically connected together by the wires 116. The wires 116 connect bonding pads 115 formed outside the light receiving area 114 to interconnection pads 111 formed along an edge of the substrate 110.

The housing body 120 attached on the substrate 110 includes an upper sidewall 120a and a lower sidewall 120c. A middle sidewall 120b is disposed between the upper sidewall 120a and the lower sidewall 120c and allows the IR cut filter 130 to be attached thereto. A lens holder 146 is adhered to the inside of the upper sidewall 120a. The upper sidewall 120a of the housing body 120 and the filter 130 define a first cavity into which the lens assembly 140 is inserted. The lower sidewall 120c of the housing body 120 and the filter 130 define a second cavity over the image sensor package composed of the substrate 110, the image sensor chip 112, and the wires 116.

In the conventional image sensor module structure 100, the housing body 120 may have various structures. However, the various structures of the housing body 120 share a common thing; the lower sidewall 120c in the image sensor module structure 100 including the wire bonding package is attached to an outermost edge of the substrate 110, more specifically, to a top surface of the substrate 110 outside the interconnection pads 111 to which the wires 116 are connected. Further, a height h3 of the lower sidewall 120c is greater than the sum of a height $h_1$ of the image sensor chip 112 and a loop height $h_2$ of the wires 116 so that the wires 116 can reside in the second cavity (see U.S. Pat. No. 6,389,687).

The filter 130 is inserted and attached to the middle sidewall 120b. As shown in FIG. 1, the middle sidewall 120b may inwardly project as compared with the upper sidewall 120a and the lower sidewall 120c so that the filter 130 can be easily inserted into the middle sidewall 120b. The filter 130 may be fully inserted into the middle sidewall 120b, or may be disposed beyond the projecting middle sidewall 120b. That is, the filter 130 is spaced from the image sensor chip 112 by a predetermined interval ($h_3$-$h_1$) due to the second cavity.

The lens assembly 140 includes a plurality of condenser lenses 142, spacers 144, and the lens holder 146. Adjacent condenser lenses of the plurality of condenser lenses 142 are spaced apart by each spacer 144, and the plurality of condenser lenses 142 are attached to the inside of the lens holder 146. A screw thread is formed along an outer wall of the lens holder 146, and a screw thread is also formed along an inner wall of the upper sidewall 120a, so that the screw threads can mesh with each other.

In the conventional image sensor module structure 100, the image sensor chip 112 is attached to the top surface of the substrate 110. The interconnection pads 111 to which the wires 116 are connected are formed outside the image sensor chip 112. The lower sidewall 120c is attached outside the interconnection pads 111. Accordingly, an area $d_1$ for the interconnection pads 111 and an area $d_2$ for the lower sidewall 120c as well as an area for the image sensor chip 112 should be prepared on the top surface of the substrate 110. The areas $d_1$ and $d_2$ result in an increase of a horizontal size of the image sensor module structure 100, thereby making it difficult to reduce the size of the image sensor module structure 100.

Conventional efforts have been made to reduce the size of the substrate 110 by attaching the lower sidewall 120c very close to the interconnection pads 111. Consequently, if slight misalignment occurs during a process of attaching the housing body 120, the wires 116 may be damaged.

Efforts have also been made to prevent impurities from entering the cavity and remaining on the light receiving area 114 by attaching the housing body 120 under vacuum. This vacuum process makes the manufacturing process more cumbersome. In addition, contact portions between the lower sidewall 120c and the substrate 110 and between the middle sidewall 120b and the filter 130 must be sealed elaborately, thereby making the manufacturing process more difficult.

SUMMARY OF THE INVENTION

Embodiments of the present invention provide an image sensor module structure with a reduced horizontal size, which is suitable for a compact mobile camera system, and a method of manufacturing the image sensor module structure.

Embodiments of the present invention also provide an image sensor module structure, which can reduce a possibility of misalignment during a process of attaching a housing on a substrate and prevent damage to wires due to misalignment, and a method of manufacturing the image sensor module structure.

Embodiments of the present invention also provide an image sensor module structure, which can reduce difficulty in sealing contact portions and can be easily manufactured using typical semiconductor manufacturing technology, and a method of manufacturing the image sensor module structure.

An image sensor module structure according to the present invention attaches a filter projecting downwardly from a housing body on an image sensor chip, so that a housing can be attached on an image sensor package without attaching the housing body on a substrate. The image sensor package is a wire bonding package where wires are interposed between the substrate and the housing body. An underfiller is filled between the substrate and the housing body using an underfill process to prevent the wires from being damaged and impurities from entering a light receiving area. However, in the image sensor module structure according to the present invention, the housing particularly, a lens assembly can have various structures and the lens assembly can be inserted and attached to the housing body in various ways.

According to an embodiment of the present invention, there is provided an image sensor module structure including an image sensor package, a housing, and an underfiller. The image sensor package includes a substrate, an image sensor chip mounted on the substrate so that a light receiving area can be oriented upward, and wires connecting interconnection pads of the substrate to bonding pads of the image sensor chip. The housing includes a housing body, a filter attached on the image sensor chip and inserted into a lower portion of the housing body to project downwardly from a bottom surface of the housing body, and a lens assembly attached on the filter inside the housing body. The underfiller is formed in a space defined by a top surface of the image sensor package, the bottom surface of the housing body, and a side surface of the projecting filter to surround the wires.

According to another embodiment of the present invention, there is provided an image sensor module structure including an image sensor package, a filter, an underfiller, a housing body, and a lens assembly. The image sensor package includes a substrate, an image sensor chip mounted on the substrate so that a light receiving area can be oriented to receive light, which is upward in this embodiment, and wires electrically connecting interconnection pads of the substrate to bonding pads of the image sensor chip. The filter may be attached on the image sensor chip outside the bonding pads. The underfiller may be formed on the bonding pads, the image sensor chip outside the bonding pads, and the substrate to surround the wire, and having a height greater than a height of a bottom surface of the filter and less than a height of a top surface of the filter. The housing body includes a lower sidewall defining on a lower portion an opening through which the filter projecting beyond the underfiller is inserted and attached, and an upper sidewall defining a cavity over the opening. The lens assembly is inserted into the cavity.

A method of manufacturing an image sensor module structure according to an embodiment of the present invention prepares a wire bonding type image sensor package and a housing that includes a filter projecting downwardly from a housing body to be inserted thereinto. The housing is attached on the image sensor package so that the projecting filter can cover a light receiving area of an image sensor chip, and then an underfiller is formed between the housing and the image sensor package.

According to still another embodiment of the present invention, there is provided a method of manufacturing an image sensor module structure. The method prepares an image sensor package and a housing. The image sensor package may include a substrate, an image sensor chip mounted on the substrate so that a light receiving area can be oriented to receive light, which is upward in this embodiment, and wires connecting interconnection pads of the substrate to bonding pads of the image sensor chip. The housing may include a housing body, a filter inserted into a lower portion of the housing body to project downwardly from a bottom surface of the housing body, and a lens assembly attached on the filter inside the housing body. Next, the method of this embodiment attaches the housing on the image sensor package so that the projecting filter can correspond to the light receiving area, and fills an underfiller in a space defined by a top surface of the image sensor package, the bottom surface of the housing body, and a side surface of the filter to surround the wires.

According to yet another embodiment of the present invention, there is provided a method of manufacturing an image sensor module structure. The method prepares a substrate and a plurality of housings. The substrate has a plurality of chip mount areas arrayed thereon so that interconnection pads are formed around each of the plurality of chip mount areas. Each of the plurality of housings includes a housing body, a filter inserted into a lower portion of the housing body to project downwardly from a bottom surface of the housing body, and a lens assembly attached on the filter inside the housing body. Next, the method attaches a plurality of image sensor chips on the plurality of chip mount areas, respectively, so that a light receiving area and bonding pads can be oriented upward. Then, the method connects the interconnection pads to the bonding pads with wires. Next, the method attaches the plurality of housings on the plurality of image sensor packages, respectively, so that the projecting filter can correspond to the light receiving area. Thereafter, the method of this embodiment fills underfillers on the substrate to surround the wires through a space between adjacent housing bodies of the plurality of housing bodies, and sequentially saws the underfillers and the substrate into individual image sensor module structures.

BRIEF DESCRIPTION OF THE DRAWINGS

The above and other features and advantages of the present invention will become more apparent by describing in detail exemplary embodiments thereof with reference to the attached drawings.

DETAILED DESCRIPTION OF THE INVENTION

Figure 1:
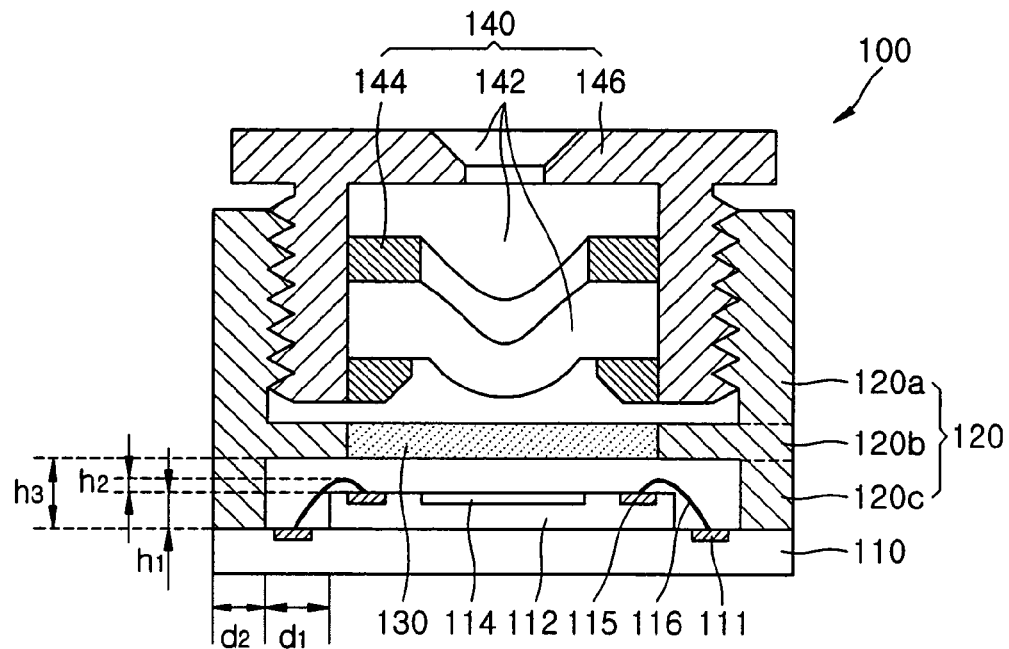
FIG. 1 is a schematic sectional view of a conventional image sensor module structure.

The present invention will now be described more fully with reference to the accompanying drawings, in which preferred embodiments of the invention are shown. The thickness of layers and/or the size of areas are exaggerated for clarity in the drawings. Like reference numerals refer to like elements throughout.

Figure 2:
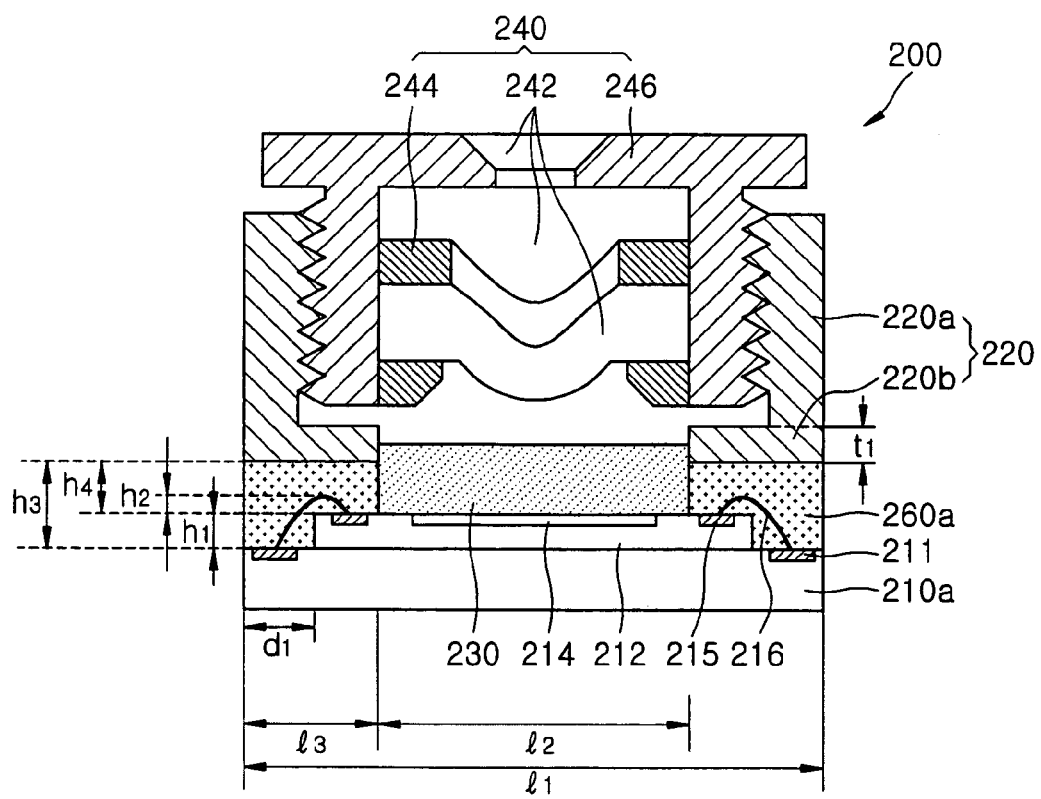
FIG. 2 is a schematic sectional view of an image sensor module structure according to an exemplary embodiment of the present invention.

FIG. 2 is a schematic sectional view of an image sensor module structure 200 according to an exemplary embodiment of the present invention.

Referring to FIG. 2, the image sensor module structure 200 includes an image sensor package composed of a substrate 210a, an image sensor chip 212, and wires 216, a housing body 220, a filter 230, a lens assembly 240, and an underfiller 260a. The housing body 220, the filter 230, and the lens assembly 240 are collectively referred to as a housing. The filter may be an optical filter, an infrared filter, an ultraviolet filter, or any combination thereof.

The image sensor package is a wire bonding type, and includes the substrate 210a, the image sensor chip 212, and the wires 216. The substrate 210a is any kind of chip carrier applicable to the image sensor package. The substrate 210a may be a printed circuit board (PCB), an aluminum-based ceramic substrate, a plastic glass laminated substrate, a tape-based substrate, or a flexible PCB. A connector (not shown) may be further provided on a rear surface of the substrate 210a to electrically interface with a flexible PCB or a socket.

A chip mount area (not shown) for the image sensor chip 212 is defined on a top surface of the substrate 210a, and a plurality of interconnection pads 211 electrically connected to the image sensor chip 212 are disposed around the chip mount area (see FIGS. 3A through 3D). The interconnection pads 211 are disposed along an outermost edge of the substrate 210a. That is, an area, which corresponds to an area $d_2$ of the substrate 110 of FIG. 1, outside the interconnection pads 211, is not needed for the housing body 220. As a result, the width of the substrate 210a can be reduced by twice $d_2$, as compared with a conventional image sensor module structure 100. For example, if the area $d_2$ of the substrate 110 is approximately 0.5 mm, the width of the substrate 210a is about 1 mm less than the width of the substrate 110. Accordingly, the size of the substrate 210a can be reduced considerably, and the size of the image sensor module package 200 using the substrate 210a can also be reduced.

There are no limitations to the kinds of the image sensor chip 212 attached on the substrate 210a. For example, the image sensor chip 212 may be a complementary metal oxide semiconductor (CMOS) image sensor, a charged coupled device (CCD) image sensor, or an image sensor where a pyroelectric ceramic is applied on a CMOS device. The image sensor chip 212 is attached on the substrate 210a so that a light receiving area 214 and bonding pads 215 disposed outside the light receiving area 214 can be oriented upward. To this end, an adhesive layer may be interposed between the image sensor chip 212 and the substrate 210a.

Although not shown, a digital signal processor (DSP) may be further interposed between the substrate 210a and the image sensor chip 212. In this case, the image sensor chip 212 is attached on the DSP. According to circumstances, the DSP may be mounted on a bottom surface of the substrate 210a. Further, the image sensor chip 212 may be a semiconductor chip combined with the DSP.

The image sensor package includes the wires 216 that electrically connect the interconnection pads 211 to the bonding pads 215. The wires 216 may be made of a conductive alloy of gold. There are no limitations to bonding the wires 216, and accordingly, wire bonding can be achieved in various ways, such as forward bonding or a reverse bonding. The wires 216 have a predetermined loop height $h_2$, and a maximum height of the wires 216 from the top surface of the substrate 210a becomes $h_1+h_2$.

Still referring to FIG. 2, the housing that includes the filter 230 projecting downwardly is attached on the image sensor package composed of the substrate 210a, the image sensor chip 212, and the wires 216. To be specific, the filter 230 is attached on the image sensor chip 212 to cover the light receiving area 214. An upper portion of the filter 230 is inserted into the housing body 220, and a remaining lower portion of the filter 230 projects by a predetermined thickness $h_4$. For a preferred embodiment, the thickness $h_4$ of the projection of the filter 230 may be greater than the loop height $h_2$ of the wires 216 so that the wires 216 cannot touch the housing body 220.

The filter 230 permits light to be incident on the light receiving area 214, and acts as a window for keeping the light receiving area 214 airtight. An infrared (IR) cut filter may be used as the filter 230. The filter may be made of glass coated with an IR cut film. It is preferable that the filter 230 be large enough to cover the light receiving area 214 but small enough not to contact the wires 216.

The filter 230 may be attached on the image sensor chip 212 using adhesive means. Examples of the adhesive means usable in the embodiments of the present invention are illustrated in FIGS. 3A through 3D. It is preferable that adhesive patterns 250a, 250b, 250c, and 250d made of epoxy resin be used as the adhesive means. However, there are no limitations in the kinds of materials of the adhesive patterns 250a, 250b, 250c, and 250d. Referring to FIGS. 3A through 3D, the adhesive patterns 250a, 250b, 250c, and 250d are formed in a space between the light receiving area 214 and the bonding pads 215.

Figure 3A:
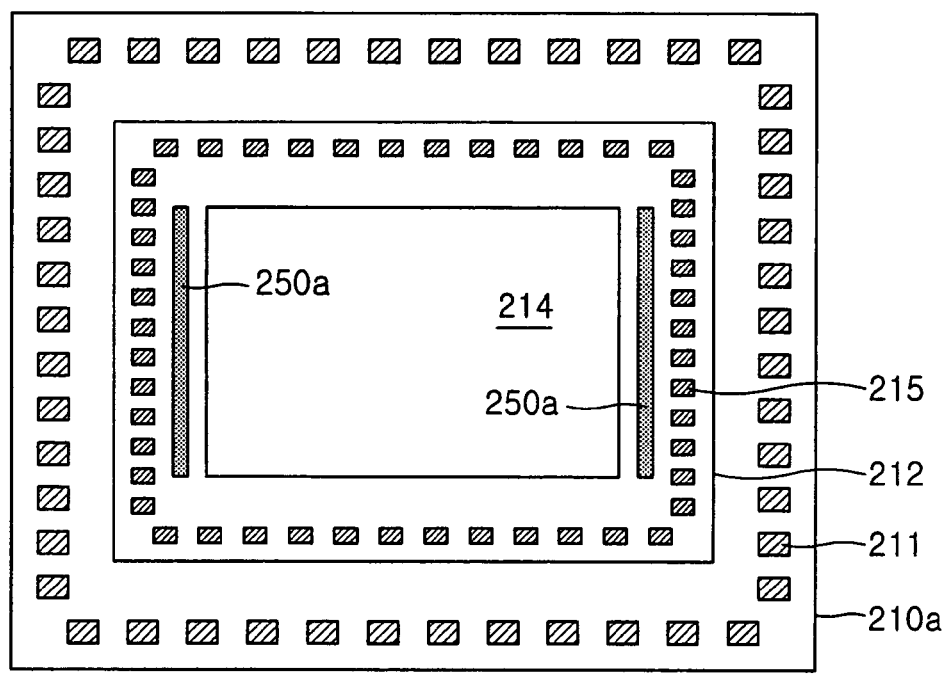
FIGS. 3A through 3D are top plan views illustrating adhesive patterns formed on an image sensor chip.
Figure 3B:
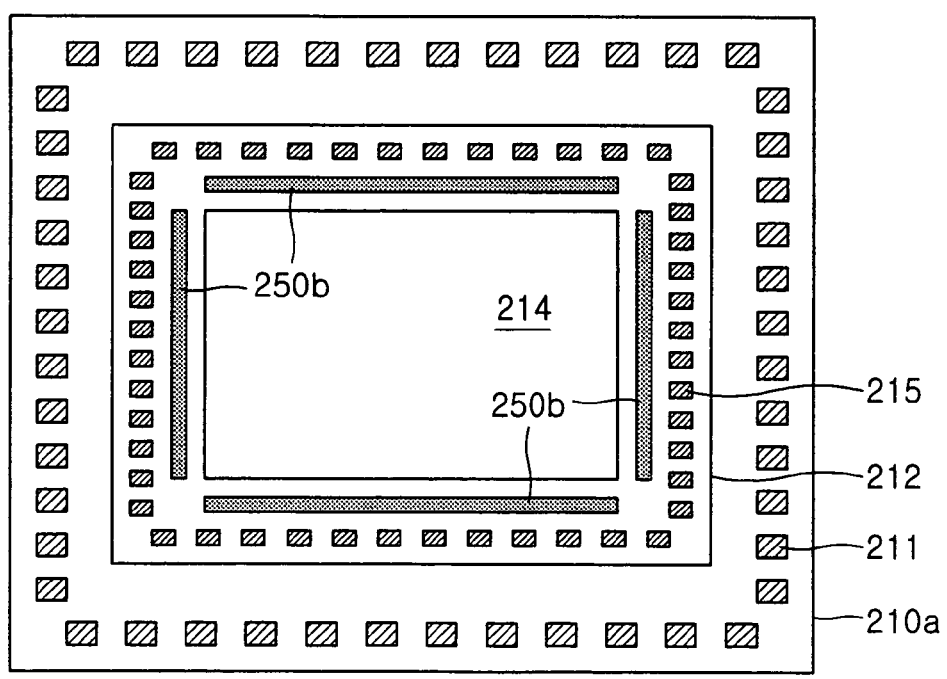
Figure 3C:
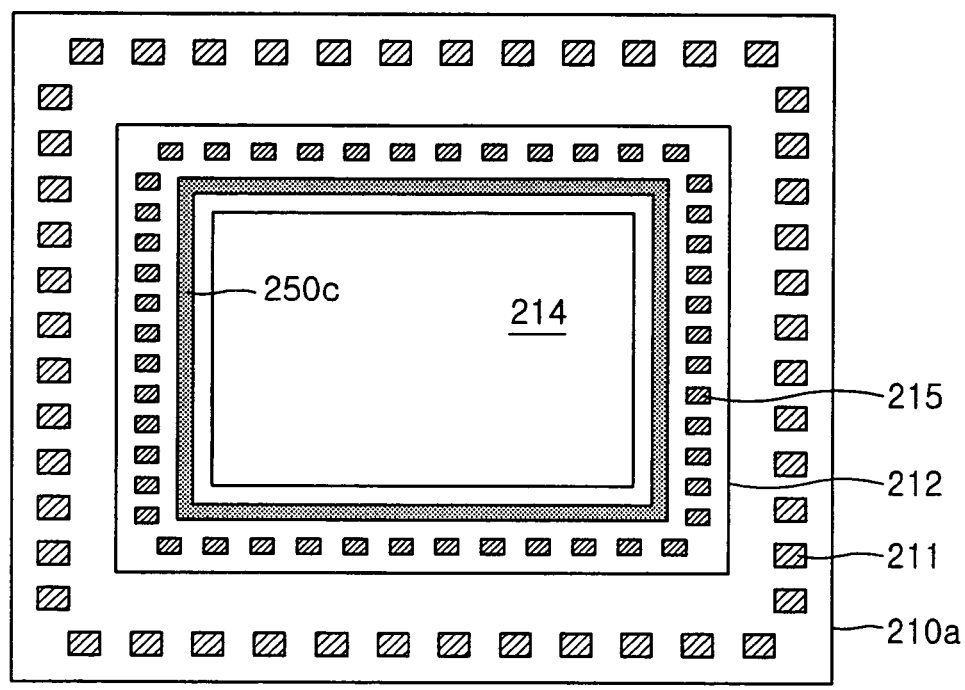

Referring to FIG. 3A, the adhesive patterns 250a may be a pair of line patterns each on opposite sides of the light receiving area 214. In other words, the light receiving area 214 is interposed between the line patterns. Although the pair of adhesive patterns 250a are formed on both side surfaces of the light receiving area 214 in FIG. 3A, the pair of adhesive patterns 250a may be formed above and below the light receiving area 214, respectively. Referring to FIG. 3B, the adhesive patterns 250b may be two pairs of line patterns, each of the respective pairs being on opposite sides of the light receiving area 214. In other words, the light receiving area 214 is interposed between each of the two pairs of line patterns. Referring to FIGS. 3A and 3B, there are no limitations to the length of the adhesive patterns 250a and the 250b. However, in order to enhance the adhesive strength of the filter 230, the adhesive patterns 250a and 250b should not be too short. Referring to FIG. 3C, the adhesive patterns 250c may be rectangular patterns surrounding an outer wall of the light receiving area 214. In this case, the adhesive patterns 250c may be made by joining ends of the line adhesive patterns 250b shown in FIG. 3B.

Figure 3D:
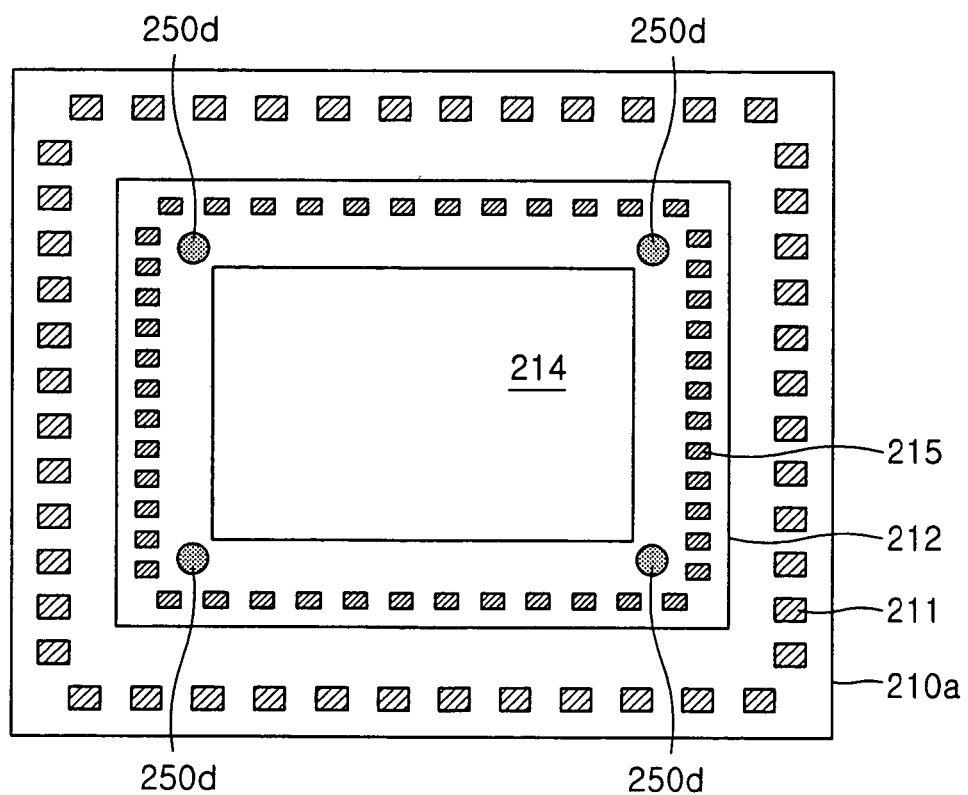

Referring to FIG. 3D, the adhesive patterns 250d may be island patterns, not line patterns. In this case, as shown in FIG. 3D, the adhesive patterns 250d may be formed only outside angular points of the light receiving area 214. Further, in this embodiment, at least four island patterns in addition to the adhesive patterns 250d may be further formed outside four edges of the light receiving area 214.

Referring to FIG. 2 again, the housing body 220 with a lower portion into which the filter 230 is inserted is positioned on the image sensor package composed of the substrate 210a, the image sensor chip 212, and the wires 216. The housing body 220 includes a lower sidewall 220b that defines an opening through which the filter 230 is inserted, and an upper sidewall 220a that defines a cavity into which a lens holder 246 is inserted. The upper sidewall 220a and the lower sidewall 220b may be attached to each other as separate members, or may be integrally formed as a single member.

Referring again to the embodiment of FIG. 2, a screw thread is formed on an inner surface of the upper sidewall 220a, and a screw thread is formed on an outer surface of the lens holder 246, so that the upper sidewall 220a and the lens holder 246 can be easily assembled and a focal point of light received through lenses 242 can be adjusted by engaging the screw threads. However, the upper sidewall 220a has the screw thread exemplarily, and may have various modified structures well known to one of ordinary skill in the art. For example, the inner surface of the upper sidewall 220a and the outer surface of the lens holder 246 may be flat surfaces.

The lower sidewall 220b extends horizontally from a bottom of the upper sidewall 220a and projects inwardly. However, since there is no need for the lower sidewall 220b to be attached on the substrate 210a, a vertical projection, such as a portion 120c of FIG. 1, is not necessary. A length $l_3$ of the inward projection of the lower sidewall 220b is determined by a length $l_2$ of the filter 230 and a length $l_1$ of the substrate 210a. As shown in FIG. 2, if a sidewall of the housing body 220 and a sidewall of the substrate 210a are in the same straight line, a whole length $l_3$ of the lower sidewall 220b containing the inward projection is equal to a half of a remainder after subtraction of the length $l_2$ of the filter 230 from the length $l_1$ of the substrate 210a.

The lower sidewall 220b has a predetermined height $t_1$, and the filter 230 can be inserted into the lower sidewall 220b to part of the height $t_1$ or up to the height $t_1$ of the lower sidewall 220b. Considering that the filter 230 may be as thin as possible, it is preferable that the filter 230 be inserted into the housing body 220 to part of the height $t_1$ from a bottom of the lower sidewall 220b.

The housing body 220 may be easily formed using injection molding. Accordingly, the housing body 220 may be made of plastic or ceramic suitable for the injection molding.

Still referring to the embodiment of FIG. 2, the underfiller 260a is formed in a space defined by a top surface of the image sensor package composed of the substrate 210a, the image sensor chip 212, the wires 216, a side surface of the filter 230, and a bottom surface of the housing body 220. The underfiller 260a is formed on exposed surfaces of the substrate 210a and the image sensor chip 212 to surround the wires 216. In a preferred embodiment the underfiller 260a completely fills in the space. The underfiller 260a may seal the image sensor package composed of the substrate 210a, the image sensor chip 212, and the wires 216. Further, in a preferred embodiment the underfiller 260a may contact the bottom surface of the housing body 220 and therefore support the housing body 220. Considering the functions of the underfiller 260a, in a preferred embodiment the underfiller 260a may be made of a material with superior adhesive and sealing properties. For example, the underfiller 260a may be made of a molding resin, such as an epoxy molding compound.

Still referring to FIG. 2, the lens assembly 240 inserted into the cavity defined by the upper sidewall 220a of the housing body 220 may include the lens holder 246, spacers 244, and the plurality of lenses 242. The lens assembly 240 may be the same as a conventional lens assembly, and there are no special limitations in the structure of the lens assembly 240 and the method of coupling the lens assembly 240. For example, the outer surface of the lens holder 246 may have a screw thread or may be flat. The lens holder 246 is inserted into the upper sidewall 220a to be coupled or attached to the upper sidewall 220a. The lens holder 246 may be made of plastic by injection molding, like the housing body 220. Inside the lens holder 246, adjacent lenses of the plurality of lenses 242 may be spaced apart by each spacer 244.

As described above, the image sensor module structure 200 of this embodiment includes the substrate 210a that has the interconnection pads 211 formed on the outermost edge thereof, and the housing that has the filter 230 projecting from the bottom surface of the housing body 220. The projecting filter 230 may be attached on the image sensor chip 212 using the various adhesive patterns 250a, 250b, 250c, or 250d. Furthermore, the underfiller 260a may fill in the space between the housing body 220 and the image sensor package composed of the substrate 210a, the image sensor chip 212, and the wires 216.

A method of manufacturing an image sensor module structure according to an exemplary embodiment of the present invention will be explained with reference to FIGS. 4A through 4E. FIGS. 4A through 4E are schematic sectional views illustrating sequential operations of the method of manufacturing the image sensor module structure.

Figure 4A:
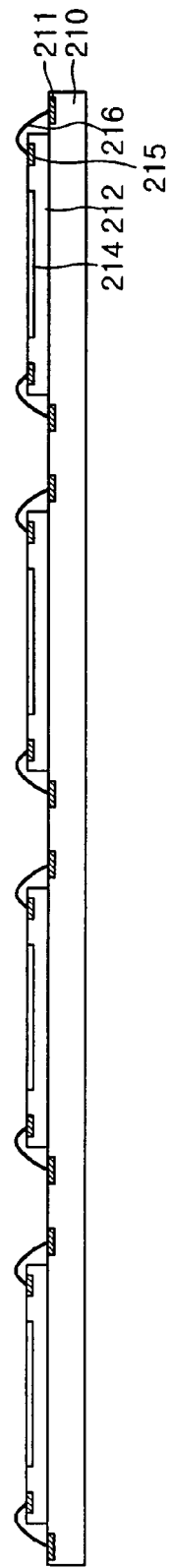
FIGS. 4A through 4E are sectional views illustrating sequential operations of a method of manufacturing an image sensor module structure according to an exemplary embodiment of the present invention.

Referring to FIG. 4A, a substrate 210 is prepared. A plurality of chip mount areas (not shown) are defined on the substrate 210. A plurality of interconnection pads (not shown) are formed around each chip mount area. One chip mount area and a plurality of interconnection pads formed around the chip mount area constitute the substrate 210a as shown in FIG. 2. Scribe areas where a cut is made to divide the substrate 210 are formed around the plurality of interconnection pads. In the present embodiment, each of the areas for housing bodies does not need to be formed on the substrate 210 between the scribe areas and the interconnection pads.

Next, image sensor chips 212 are mounted and attached to the corresponding chip mount areas on the substrate 210. Each image sensor chip 212 is attached on the substrate 210 so that the light receiving area 214 and the bonding pads 215 can be oriented upward. Although not shown, an adhesive layer may be interposed between the image sensor chip 212 and the substrate 210 to easily attach the image sensor chip 212 to the substrate 210. Then, a wire bonding process may be performed to connect the bonding pads 215 to the interconnection pads 211. Since the chip attachment process and the wire bonding process are performed using typical semiconductor package technology, a detailed explanation will not be given.

Figure 4B:
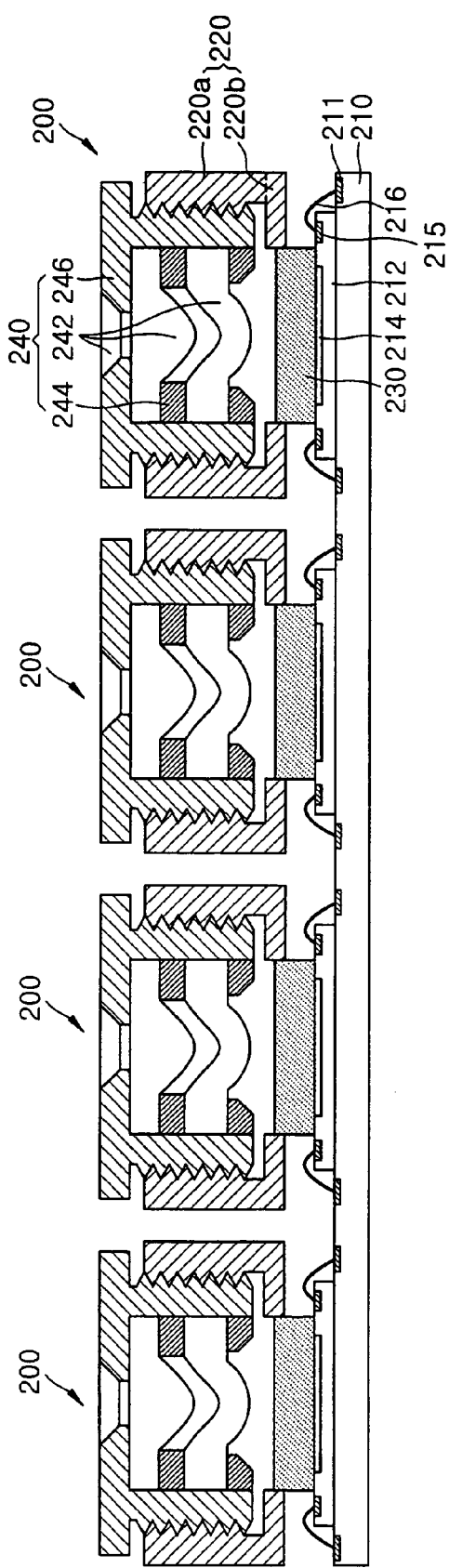

Referring to FIG. 4B, housings each composed of the housing body 220, the filter 230, and the lens assembly 240 are attached on the image sensor chips 212. To this end, the housing body 220, the filter 230, and the lens assembly 240 may be prepared separately.

The housing composed of the housing body 220, the filter 230, and the lens assembly 240 can be prepared using typical technology in the art. For example, first, the housing body 220 is prepared using injection molding or the like. The housing body 220 includes the upper sidewall 220a that defines the cavity, and the lower sidewall 220b that inwardly projects from the bottom of the upper sidewall 220a to define the opening. The housing body 220 may be formed by forming strips comprising a set of housing bodies that are integrally connected together, and then separating the set of housing bodies. Alternatively, the housing body 220 may be formed individually from the start. Or, according to some embodiments, the filter 230 and/or the lens assembly 240 may be inserted and/or attached prior to the singulation of the set of housing body strips, not after the singulation. A detailed explanation thereof will be omitted. Once the housing body 220 is prepared, the separately prepared filter 230 is inserted through the opening to be attached to the lower sidewall 220b. In this case, as described previously, the filter 230 is inserted into the lower sidewall 220b to a height greater than the loop height of the wires 216. The separately prepared lens assembly 240 is coupled or attached to the upper sidewall 220a through the cavity. According to some embodiments, the lens holder 246 may be first attached to the upper sidewall 220a and then the spacers 244 and the lenses 242 may be coupled to the lens holder 246.

Next, the prepared housing composed of the housing body 220, the filter 230, and the lens assembly 240 may be attached on the image sensor chip 212. To this end, the line or island adhesive patterns 250a, 250b, 250c, or 250d as shown in FIGS. 3A through 3D may be formed on the image sensor chip 212. The line adhesive patterns 250a, 250b, or 250c are preferable, and the two pairs of line patterns 250b or the rectangular line patterns 250c are more preferable. This is because the line patterns 250a, 250b, or 250c function as dams, and thus, can prevent more effectively the underfiller 260a from entering an interface between the image sensor chip 212 and the filter 230 during a subsequent process of applying the underfiller 260a.

As described above, the adhesive patterns 250a, 250b, 250c, or 250d may be made of epoxy resin. In this case, it is preferable that the epoxy resin applied between the bonding pads 215 and the light receiving area 214 on the image sensor chip be in a B-stage where the resin is in a semisolid or gel state. This is because epoxy resin in a liquid state may flow over the light receiving area 214 during the attachment process and epoxy resin in a solid state is not easily molded and makes it difficult to operate. After the semisolid adhesive patterns 250a, 250b, 250c, or 250d are formed, a bottom surface of the projection of the filter 230 may be attached on the semisolid adhesive patterns 250a, 250b, 250c, or 250d under a predetermined pressure and then heated under a predetermined temperature to be cured. As a result, the housing composed of the housing body 220, the filter 230, and the lens assembly 240 can be firmly attached to the image sensor package composed of the substrate 210, the image sensor chip 212, and the wires 216 without contacting the wires 216.

Figure 4C:
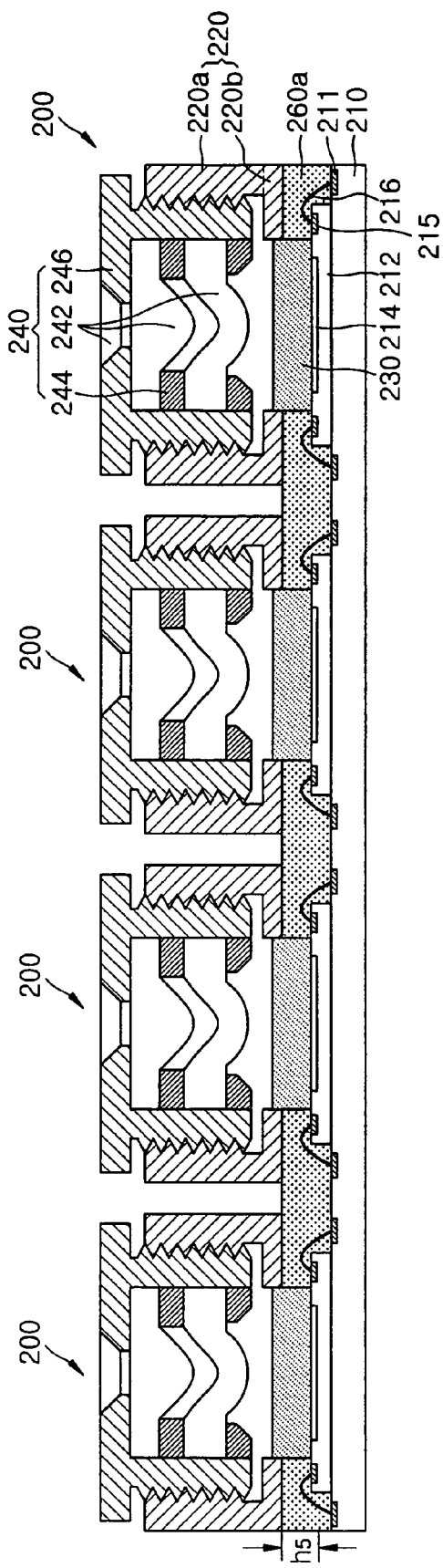

Referring to FIG. 4C, the underfiller 260a made of a molding resin, such as an epoxy molding compound, may fill in a space between the substrate 210 and the housing including the housing body 220, the filter 230, and the lens assembly 240. In preferred embodiment the underfiller 260a may be made of a molding resin to fill in the space by an underfill process and then thermally cured. A height h5 of the underfiller 260a should be greater than a maximum height of the wires 216. It is preferable that the underfiller 260a be formed up to the bottom surface of the housing body 220 to completely seal the image sensor chip 212 and the wires 216 and increase the adhesive strength of the housing composed of the housing body 220, the filter 230, and the lens assembly 240. Moreover, the height h5 of the underfiller 260a may be greater than a height to the bottom surface of the housing body 220 from the substrate 210. After the underfiller 260a is formed, the plurality of image sensor module structures 200 arranged on one substrate 210 are completed.

Figure 4D:
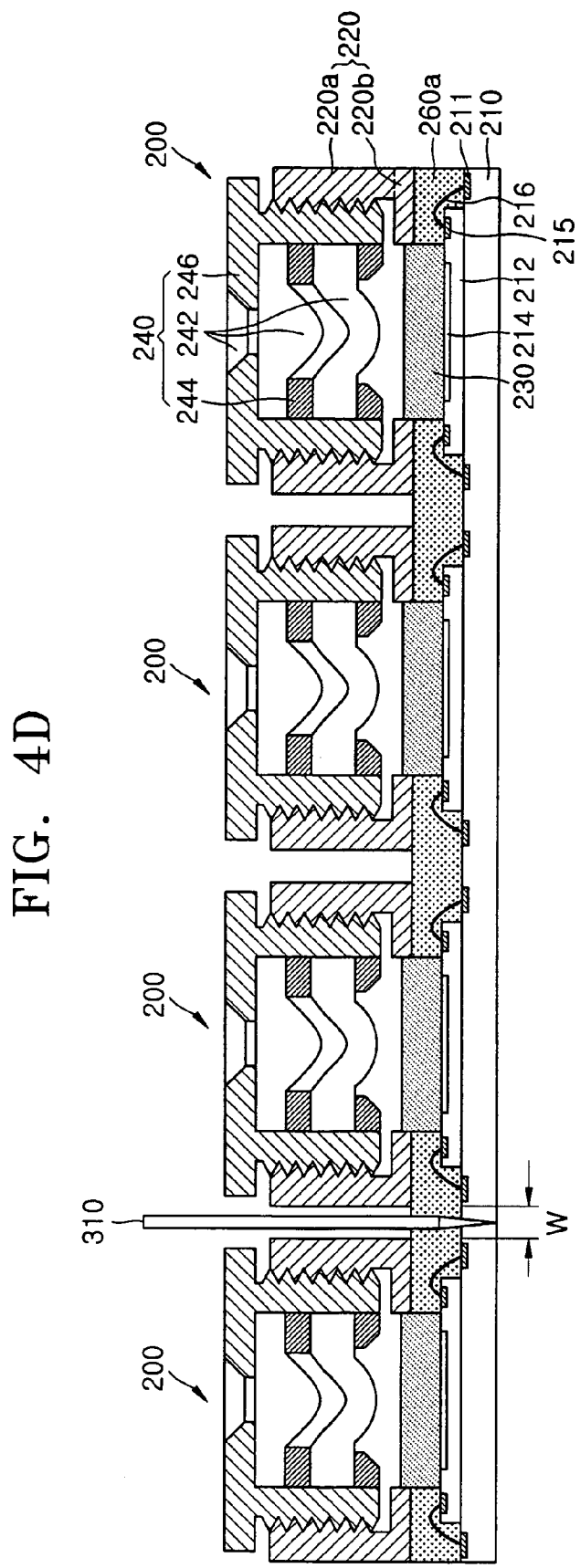

Referring to FIG. 4D, the array of the plurality of image sensor module structures 200 on the one substrate 210 is sawed into individual image sensor module structures. During the sawing process, the underfiller 260a and the substrate 210 may be sequentially cut using a blade 310 that is exemplary shown. The blade 310 having a width equal to a width w between adjacent housing bodies 220 or having a width smaller than the width w may be used during the sawing process to perform a single cutting process. Further, if necessary, two or more blades 310 having different widths may be used to perform a stop cutting process where the sawing process is repeatedly performed by steps.

Figure 4E:
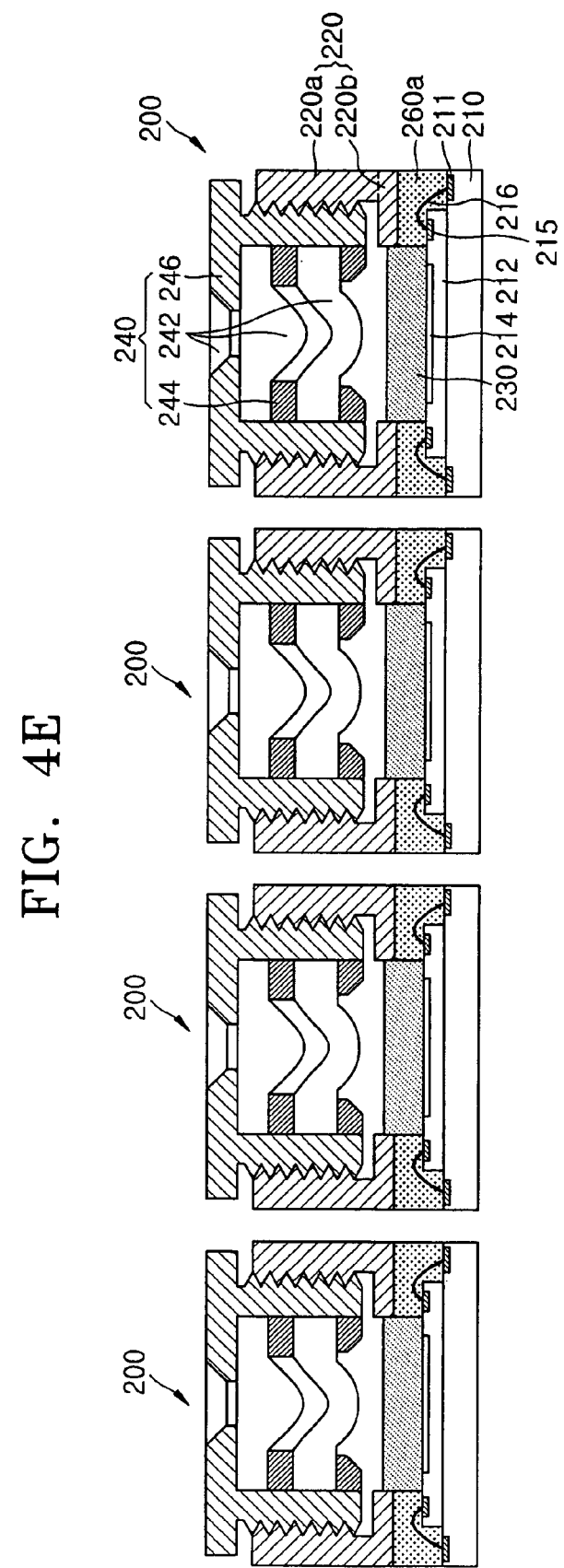

FIG. 4E illustrates the plurality of individual image sensor module structures 200 as a result of the sawing process using the blade 310 with the same width as the width w between the adjacent housing bodies 220. In this case, in each of the image sensor module structures 200, the outer sidewall of the housing body 220, the outer sidewall of the underfiller 260a, and the outer sidewall of the substrate 210a are in a straight line.

The method of manufacturing the image sensor module structure using a matrix strip process according to the exemplary embodiment of the present invention has been exemplarily described. That is, in the present embodiment, the set of the plurality of housings is attached on the image sensor chips arranged on one substrate, and then separated by the sawing process. However, it is obvious to those of ordinary skill in the art that the present invention can be applied to an embodiment where the array of the image sensor packages is separated and then a housing is attached to each individual image sensor package and an underfiller is formed. Accordingly, an explanation thereof will be omitted. Also, various changes in form and details may be made in the present invention without departing from the spirit and scope of the present invention as defined by the following claims.

Since the image sensor module structure according to an embodiment of the present invention uses the substrate that has the interconnection pads formed on the outermost edge thereof, and attaches the housing on the substrate using the filter that projects from the bottom surface of the housing, the size of the image sensor module structure can be reduced. As a consequence, the image sensor module structure can be used for compact portable camera systems.

Since the adhesive patterns are formed in the space between the larger light receiving area and the bonding pads and the housing is attached on the substrate using the adhesive patterns, misalignment possibility during the housing attachment process is reduced and damage to the wires due to misalignment can be prevented.

Since the wires and the image sensor chip may be surrounded by the underfiller, a process of sealing contact portions can be easier. Also, since the underfiller may be formed using the underfill process of typical semiconductor package technology, the process is not difficult to achieve.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An image sensor module structure comprising:
   an image sensor package including a substrate, an image sensor chip mounted on the substrate so that a light receiving area can be oriented in a first direction, and wires connecting interconnection pads of the substrate to bonding pads of the image sensor chip;
   a housing including a housing body, a filter attached on the image sensor chip and inserted into a lower portion of the housing body to project opposite the first direction from a bottom surface of the housing body, and a lens assembly attachable inside the housing body; and
   an underfiller formed in a space defined by a top surface of the image sensor package, the bottom surface of the housing body, and a side surface of the projecting filter to surround the wires, wherein an outer side surface of the housing body, an outer side surface of the underfiller, and an outer side surface of the substrate are formed in a straight line.

2. The image sensor module structure of claim 1, wherein a projection opposite the first direction of the filter from the housing body has a thickness greater than a loop height of the wires.

3. The image sensor module structure of claim 1, wherein a height of the underfiller is greater than a maximum height of the wires.

4. The image sensor module structure of claim 1, wherein adhesive patterns are interposed between the filter and the image sensor chip.

5. The image sensor module structure of claim 4, wherein the adhesive patterns are line adhesive patterns formed between the light receiving area and the bonding pads.

6. The image sensor module structure of claim 5, wherein the line adhesive patterns are a pair of patterns with the light receiving area interposed therebetween.

7. The image sensor module structure of claim 5, wherein the line adhesive patterns are two pairs of patterns with the light receiving area interposed between each of the two pairs.

8. The image sensor module structure of claim 7, wherein ends of the two pairs of line adhesive patterns are joined to form a rectangular shape.

9. The image sensor module structure of claim 4, wherein the adhesive patterns are island patterns formed at four angular points outside the light receiving area.

10. The image sensor module structure of claim 1, wherein the underfiller is made of a molding resin.

11. The image sensor module structure of claim 1, wherein the housing body comprises:
an upper sidewall defining a cavity into which the lens assembly is inserted; and
a lower sidewall that defines an opening through which an upper surface of the filter is inserted.

12. The image sensor module structure of claim 11, wherein the lower sidewall projects inwardly from the upper sidewall.

13. An image sensor module structure comprising:
an image sensor package including a substrate, an image sensor chip mounted on the substrate so that a light receiving area can be oriented to receive light, and wires that electrically connect interconnection pads of the substrate to bonding pads of the image sensor chip;
a housing body including a lower sidewall that defines an opening, and an upper sidewall that defines a cavity over the opening;
a lens assembly inserted into the cavity;
a filter attached on the image sensor chip and located within the opening;
an underfiller formed on the bonding pads, on the image sensor chip outside the light receiving area, and on the substrate to surround the wires, the underfiller having a top surface that is higher than a bottom surface of the filter and extends at most lower than a top surface of the filter, wherein an outer side surface of the housing body, an outer side surface of the underfiller, and an outer side surface of the substrate are formed in a straight line.

14. A method of manufacturing an image sensor module structure comprising:
preparing an image sensor package that includes a substrate, an image sensor chip mounted on the substrate so that a light receiving area can be oriented in a first direction, and wires to connect interconnection pads of the substrate to bonding pads of the image sensor chip;
preparing a housing that includes a housing body, a filter inserted into a lower portion of the housing body to project opposite to the first direction from a bottom surface of the housing body, and a lens assembly attachable inside the housing body;
attaching the housing on the image sensor package so that the projecting filter can correspond to the light receiving area; and
filling an underfiller in a space defined by a top surface of the image sensor package, the bottom surface of the housing body, and a side surface of the filter, to surround the wires, wherein an outer side surface of the housing body, an outer side surface of the underfiller, and an outer side surface of the substrate are formed in a straight line.

15. The method of claim 14, wherein a thickness of the downward projection of the filter from the housing body is greater than a loop height of the wires.

16. The method of claim 14, wherein the preparing the image sensor package comprises:
attaching the image sensor chip onto the substrate so that the light receiving area can be oriented to receive light; and
connecting the interconnection pads to the bonding pads using the wires by wire bonding.

17. The method of claim 14, further comprising forming adhesive patterns on the image sensor chip prior to the attaching the housing.

18. The method of claim 17, wherein the forming the adhesive patterns comprises applying semisolid adhesive patterns between the light receiving area and the bonding pads, and the attaching the housing comprises pressing the housing against the image sensor package and thermally curing the adhesive patterns.

19. The method of claim 18, wherein in the applying the semisolid adhesive patterns, the adhesive patterns are line patterns formed between the light receiving area and the bonding pads.

20. The method of claim 19, wherein the line adhesive patterns are a pair of patterns with the light receiving area interposed therebetween.

21. The method of claim 19, wherein the line adhesive patterns are two pairs of patterns with the light receiving area between each of the two pairs.

22. The method of claim 21, wherein ends of the two pairs of line adhesive patterns are joined to form a rectangular shape.

23. The method of claim 18, wherein in the applying the semisolid adhesive patterns, the adhesive patterns are island patterns formed at four angular points outside the light receiving area.

24. The method of claim 14, wherein the underfiller is made of a molding resin.

25. A method of manufacturing an image sensor module structure comprising:
preparing a substrate having a plurality of chip mount areas arranged thereon so that interconnection pads are formed around each of the plurality of chip mount areas;
preparing a plurality of housings, each including a housing body, a filter inserted into a lower portion of the housing body to project downwardly from a bottom surface of the housing body, and a lens assembly attached on the filter inside the housing body;
attaching a plurality of image sensor chips on the plurality of chip mount areas, respectively, so that a light receiving area and bonding pads can be oriented upward;
connecting the interconnection pads to the bonding pads with wires;
attaching the plurality of housings on the plurality of image sensor packages, respectively, so that the projecting filter can correspond to the light receiving area;
filling underfillers on the substrate to surround the wires through a space between adjacent housing bodies of the plurality of housing bodies; and
sequentially sawing the underfillers and the substrate into individual image sensor module structures, wherein an outer side surface of the housing body, an outer side surface of the underfiller, and an outer side surface of the substrate are formed in a straight line.

26. The method of claim 25, wherein a thickness of the downward projection of the filter from the housing body is greater than a loop height of the wires.

27. The method of claim 25, further comprising forming adhesive patterns on the plurality of image sensor chips prior to the attaching the plurality of housings.

28. The method of claim 27, wherein the forming the adhesive patterns comprises applying semisolid adhesive patterns between the light receiving area and the bonding pads, and the attaching the housing comprises pressing the housing against the image sensor package and thermally curing the adhesive patterns.

29. The method of claim 28, wherein in the applying the semisolid adhesive patterns, the adhesive patterns are line patterns formed between the light receiving area and the bonding pads.

30. The method of claim 29, wherein the line adhesive patterns are a pair of patterns with the light receiving area interposed therebetween.

31. The method of claim 29, wherein the line patterns are two pairs of patterns with the light receiving area interposed between each of the two pairs.

32. The method of claim 31, wherein ends of the two pairs of line patterns are joined to form a rectangular shape.

33. The method of claim 28, wherein in the applying the semisolid adhesive patterns, the adhesive patterns are island patterns formed at four angular points outside the light receiving area.

34. The method of claim 25, wherein the underfiller is made of a molding resin.

35. The method of claim 25, wherein in the filling the underfillers, the underfillers have a height greater than a maximum height of the wires.

36. An image sensor module structure comprising:
a substrate;
an image sensor chip mounted on the substrate;
wires connecting interconnection pads of the substrate to bonding pads of the image sensor chip;
an underfiller layer encapsulating the wires; and
a housing body having a lens assembly, the housing body disposed on the underfiller layer, wherein an outer side surface of the housing body, an outer side surface of the underfiller, and an outer side surface of the substrate are formed in a straight line.

37. The image sensor module structure of claim 36, wherein the lens assembly includes a filter.

* * * * *